United States Patent
Kijima et al.

(10) Patent No.: US 7,077,911 B2
(45) Date of Patent: Jul. 18, 2006

(54) MOCVD APPARATUS AND MOCVD METHOD

(75) Inventors: Takeshi Kijima, Matsumoto (JP); Eiji Natori, Chino (JP); Mitsuhiro Suzuki, Tokyo (JP)

(73) Assignees: Seiko Epson Corporation, Tokyo (JP); Youtec Co., Ltd., Nagareyama (JP)

( * ) Notice: Subject to any disclaimer, the term of this patent is extended or adjusted under 35 U.S.C. 154(b) by 0 days.

(21) Appl. No.: 10/376,276

(22) Filed: Mar. 3, 2003

(65) Prior Publication Data

US 2005/0172895 A1    Aug. 11, 2005

(51) Int. Cl.
*H01L 21/00* (2006.01)
*C23C 16/00* (2006.01)

(52) U.S. Cl. .............. 118/715; 118/730; 118/720; 118/725; 156/345.33; 156/345.34

(58) Field of Classification Search ............... 118/715, 118/730, 720, 725; 156/345.33, 345.34
See application file for complete search history.

(56) References Cited

U.S. PATENT DOCUMENTS

| | | | | |
|---|---|---|---|---|
| 5,108,792 A | * | 4/1992 | Anderson et al. | 427/248.1 |
| 6,143,077 A | * | 11/2000 | Ikeda et al. | 118/715 |
| 6,537,838 B1 | * | 3/2003 | Stockman | 438/22 |
| 2003/0011022 A1 | * | 1/2003 | Manabe | 257/314 |

FOREIGN PATENT DOCUMENTS

| | | | | |
|---|---|---|---|---|
| JP | 01096924 A | * | 4/1989 | |
| JP | 05136045 A | * | 6/1993 | |
| JP | 2000260762 A | * | 9/2000 | |
| JP | 2001077108 A | * | 3/2001 | |

* cited by examiner

*Primary Examiner*—Ram N Kackar
(74) *Attorney, Agent, or Firm*—Oliff & Berridge, PLC.

(57) ABSTRACT

The invention provides an MOCVD apparatus and a MOCVD method which can deposit a thin film having satisfactory properties by reducing or preventing temperature decrease of a source gas. An MOCVD apparatus according to the present invention supplies a source gas, as a mixture of an MO source gas, with an oxidizing gas to a substrate to thereby form a film. The MOCVD apparatus includes a substrate holder to hold the substrate; a deposition chamber to house the substrate holder; a supply mechanism to supply the source gas to a surface of the substrate; and a heating device to heat the substrate held by the substrate holder. The deposition chamber includes a substrate housing unit to house the substrate holder holding the substrate, and a passage housing unit connected to the substrate housing unit and constituting a passage to supply the source gas to the substrate. The passage has a cross-sectional area that is smaller than the area of a deposition plane of the substrate when the passage housing unit is cut in parallel with the deposition plane of the substrate.

7 Claims, 2 Drawing Sheets

(a)

(b)

MOCVD APPARATUS AND MOCVD METHOD

BACKGROUND OF THE INVENTION

1. Field of Invention

The present invention relates to an MOCVD apparatus and method in which a source gas, as a mixture of an MO source gas with an oxidizing gas, is supplied to thereby form films.

2. Description of Related Art

Related art MOCVD (metal organic chemical vapor deposition) apparatus are CVD apparatus using an organometallic compound as a source or raw material, and generally use powders or other raw materials which are solid or liquid at normal pressure and temperature. In these MOCVD apparatus, such a raw material is provided in a container, is heated under reduced pressure and is thereby vaporized. The vaporized gaseous material is transmitted with a carrier gas toward a deposition chamber. A passage through which the source gas flows is thereby always heated. In addition, oxygen gas is supplied to the passage of the source gas. Then, a gaseous mixture of the source gas and oxygen gas is supplied into the deposition chamber. The material used in MOCVD remains gaseous before reaching the substrate in the deposition chamber, is thermally decomposed and undergoes a combustion reaction on the substrate to thereby form a thin film on the substrate.

In the related art MOCVD apparatus, the deposition chamber has a large volume or capacity, the source gas supplied to the deposition chamber adiabatically expands and thereby the temperature thereof decreases. Such a source gas having a decreased temperature may not form a thin film having satisfactory properties on the substrate.

In addition, the oxygen gas, to mix with the source gas, is supplied at room temperature, and thereby temperature of the source gas further decreases. Thus, a thin film having satisfactory quality cannot be significantly obtained.

SUMMARY OF THE INVENTION

The present invention addresses the above and/or other circumstances, and provides an MOCVD apparatus and an MOCVD method that can form a thin film having satisfactory properties by reducing or suppressing temperature decrease of a source gas.

To address or solve the above, the present invention provides, in accordance with a first aspect, an MOCVD apparatus to supply a source gas, as a mixture of an MO source gas, with an oxidizing gas to a substrate to thereby form a film. The apparatus includes a substrate holder to hold the substrate; a deposition chamber to house the substrate holder; a supply mechanism to supply the source gas to a surface of the substrate; and a heating device to heat the substrate held by the substrate holder. The deposition chamber includes a substrate housing unit to house the substrate holder holding the substrate, and a passage housing unit is connected to the substrate housing unit and constitutes a passage to supply the source gas to the substrate. The passage has a cross-sectional area that is smaller than the area of a deposition plane of the substrate when the passage housing unit is cut in parallel with the deposition plane of the substrate.

According to the MOCVD apparatus, the adiabatic expansion of the source gas can be reduced or suppressed to thereby effectively reduce or suppress temperature decrease of the source gas due to adiabatic expansion by reducing the inner volume of the passage housing unit of the deposition chamber. A thin film having satisfactory properties can thereby be formed.

In another aspect, the present invention provides an MOCVD apparatus to supply a source gas, as a mixture of an MO source gas, with an oxidizing gas to a substrate to thereby form a film. The apparatus includes a substrate holder to hold the substrate; a deposition chamber to house the substrate holder; a gas inlet arranged in the deposition chamber; a supply mechanism to supply the source gas to the gas inlet; and a heating device to heat the substrate held by the substrate holder. A gas passage in the deposition chamber has a cross-sectional area that is 100 times or less as large as the opening area of the gas inlet, which cross-sectional area is obtained by cutting the deposition chamber in a direction perpendicular to a flow direction of the source gas when the supply mechanism supplies the source gas to the gas inlet to thereby supply the source gas to the substrate in the deposition chamber.

According to the MOCVD apparatus mentioned above, the adiabatic expansion of the source gas can be reduced or suppressed to thereby effectively reduce or suppress the temperature decrease of the source gas due to adiabatic expansion by reducing the volume of the gas passage in the deposition chamber. A thin film having satisfactory properties can thereby be formed.

In the MOCVD apparatus according to the present invention, it is acceptable that the supply mechanism includes an MO source container housing the MO source, a first heating mechanism to heat the MO source in the MO source container, an oxidizing gas container housing the oxidizing gas, and a second heating mechanism to heat the oxidizing gas in the oxidizing gas container, and the MO source container and the oxidizing gas container are connected to the gas inlet, respectively. By heating the oxidizing gas by the second heating mechanism and introducing the heated oxidizing gas into the gas inlet, the temperature decrease of the source gas can thereby be further reduced or suppressed.

The MOCVD apparatus according to the present invention can further include a rotating mechanism to rotate the substrate holder. By this configuration, films are sequentially formed in part of the surface of the substrate to thereby form a film on the entire surface of the substrate ultimately.

The MOCVD apparatus according to the present invention can further include an ultrasonic generator to apply ultrasonic vibration to at least one of the supply mechanism and the substrate holder.

The MOCVD apparatus according to the present invention can further include an ultraviolet irradiation device or a soft X-ray irradiation device to apply ultraviolet rays or soft X-rays to the substrate held by the substrate holder. Thus, the thin film deposited on the substrate can be crystallized at low temperatures.

The present invention further provides, in accordance with a second aspect of the invention, an MOCVD method to form a thin film using the MOCVD apparatus. The method includes: holding the substrate on the substrate holder; supplying the source gas, as a mixture of the MO source gas, with the oxidizing gas to a surface of the substrate by action of the supply mechanism to thereby form a thin film on the substrate; and heating the substrate by the heating device.

The MOCVD method according to the present invention can further include: supplying the source gas to the surface of the substrate while applying ultrasonic vibration to at least one of the supply mechanisms and the substrate holder in the forming of a thin film.

The MOCVD method according to the present invention can further include: applying ultraviolet rays or soft-X rays to the thin film between the forming of the thin film and the heating. Thus, the thin film can be crystallized at low temperatures.

DETAILED DESCRIPTION OF PREFERRED EMBODIMENTS

Exemplary embodiments of the present invention are discussed below with reference to the attached drawings.

Figure 1:
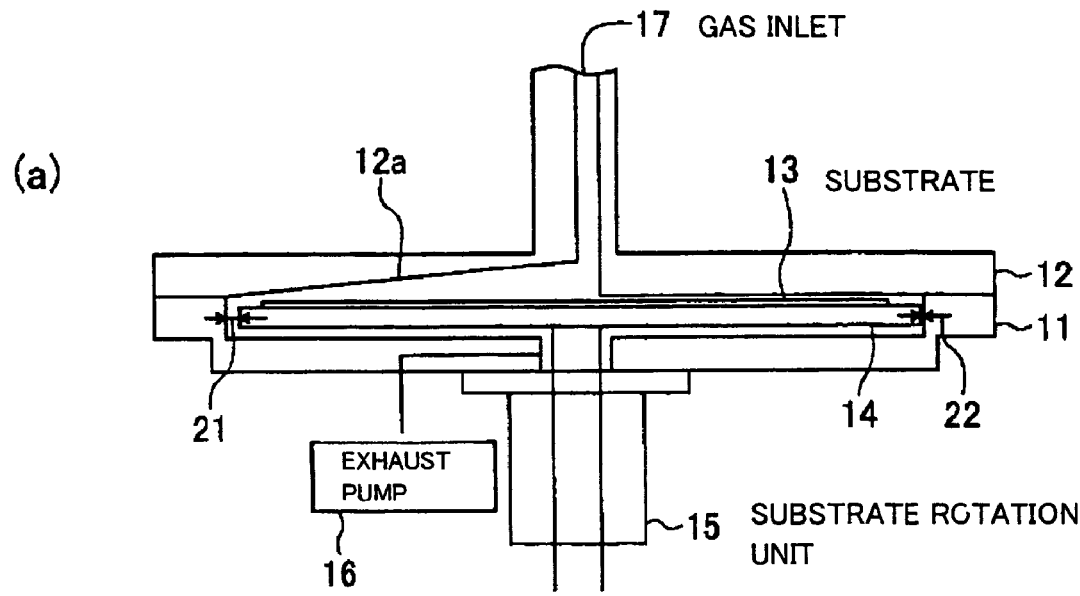
FIGS. 1(a) and 1(b) are schematics of an MOCVD apparatus as a first exemplary embodiment of the present invention.
Figure 1:
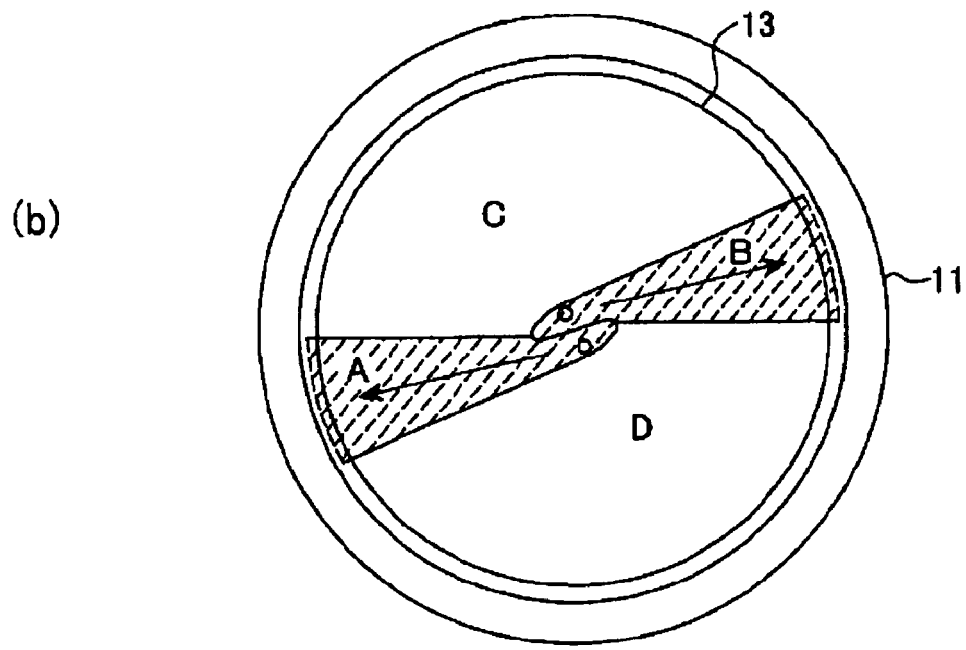

FIG. 1(a) is a schematic sectional view of an MOCVD apparatus as the first embodiment of the present invention, and FIG. 1(b) is a top view of the MOCVD apparatus shown in FIG. 1(a).

FIGS. 1(a) and 1(b) show that the MOCVD apparatus includes a deposition chamber which includes a lower chamber 11 and an upper chamber 12. By connecting the lower chamber 11 with the upper chamber 12, an inner space of the chamber is formed as shown in FIG. 1(a). A rotary substrate holder 14 to hold a substrate 13 is arranged in an inner space of the lower chamber 11. The substrate holder 14 has a rotation axis which is inserted into a substrate rotation unit 15. The substrate rotation unit 15 rotates the rotation axis to thereby rotate the substrate holder 14. An exhaust pump 16 is arranged in the vicinity of the lower chamber 11. The exhaust pump 16 serves to exhaust raw materials after deposition and other substances from under the substrate holder 14.

A deposition plane of the substrate 13 on which a film is deposited in the deposition chamber has a substantially sectional region (region A) formed between a segment of the periphery (circumference) of the substrate 13 and the vicinity of the center of the circumference, as shown in FIG. 1(b). The segment constitutes one sixth or less of the circumference. The upper chamber 12 locating above the region A has a slope 12a in cross-section, as shown in FIG. 1(a). The slope 12a is formed only above the region A on the substrate 13, and the inner wall of the upper chamber 12 located above a region other than the region A on the substrate forms a flat plane. The region other than the region A on the substrate 13 is arranged as near as possible to the inner wall of the upper chamber 12. The distance between the slope 12a and the substrate is larger than that between the flat region and the substrate. A gas inlet 17 is arranged in the upper chamber 12, is connected to the slope 12a and locates in the vicinity of the center of the substrate surface.

The periphery of the substrate holder 14 in a region corresponding to the region A is arranged at a set distance 21 from the inner wall of the lower chamber 11. The periphery of the substrate holder 14 corresponding to a region other than the region A is arranged as near as possible to the inner wall of the lower chamber 11 at a distance 22. The distance 22 is smaller than the set distance 21. By thus forming the shape of the inner space of the chamber, most of the source gas brought from the gas inlet 17 can be brought into the region A on the substrate. Namely, the source gas flows from the center to the periphery of the substrate as indicated by an arrow in the region A.

The gas inlet 17 is connected via a pipe (not shown) to an MO source container (not shown). The pipe has an inner diameter substantially identical to that of the gas inlet. The MO source container houses an MO source.

The MOCVD apparatus further includes a supply mechanism (not shown) to supply oxygen gas as an oxidizing gas to the pipe for the MO source. The oxidizing gas is not specifically limited to oxygen gas, and any other oxidizing gas can be used. In the MOCVD apparatus, the MO source gas is supplied from the MO source container to the pipe, the oxygen gas is supplied to the pipe by action of the supply mechanism, and thus a source gas as a mixture of the MO source gas and oxygen gas is brought into the inner space of the chamber from the gas inlet 17. The thus brought source gas flows along the arrow above the region A in the inner space of the chamber, passes through the periphery of and under the substrate holder 14 and is exhausted by the action of the exhaust pump 16, as shown in FIG. 1(b).

Specifically, the shape of the inner space of the chamber can be illustrated as follows. The deposition chamber is separated into a substrate housing unit and a passage housing unit. The substrate housing unit is the inner space of the lower chamber and serves to house the substrate holder 14 holding the substrate 13. The passage housing unit is connected to the substrate housing unit and constitutes a passage to supply the source gas to the substrate 13. The passage housing unit is an inner space above the region A of the substrate, which is formed by the slope 12a and the substrate 13. The passage has a cross-sectional area that is smaller than the area of the deposition plane of the substrate when the passage housing unit is cut in parallel with the deposition plane of the substrate.

More specifically, when the source gas is brought from the gas inlet 17 into the deposition chamber to thereby supply to the substrate, a gas passage in the source gas flow has a cross-sectional area 100 times or less as large as the opening area of the gas inlet, which cross-sectional area is obtained by cutting the deposition chamber in a direction perpendicular to a flow direction of the source gas. By thus forming the gas passage, the volume of the inner space of the chamber can be reduced. Thus, the temperature decrease of the source gas due to adiabatic expansion can be effectively reduced or suppressed.

Infrared heating mechanisms (not shown) for RTA (rapid thermal annealing) serving as a substrate heating mechanism are arranged in a region C and a region D in the deposition chamber shown in FIG. 1(b). The infrared heating mechanisms for RTA serve to crystallize a thin film deposited on the substrate 13, and thus a film can be continuously formed and crystallized in the same chamber. Namely, while rotating the substrate, a thin film is deposited on the substrate in the region A, and carbon in the MO source is removed in the region C by heating the substrate to about 400° C., and the thin film is crystallized in the region D. The infrared heating mechanisms for RTA can be arranged at any appropriate positions. In addition, cooling mechanisms (not shown) to cool the substrate holder are arranged in the regions C and D.

The MO source container has, in an MO source outlet, an MO source control mechanism, such as a mass flow controller to control the amount of the MO source supplied from the MO source container to the pipe. The MO source container also has a heater (not shown) serving as a heating device to heat and vaporize the MO source. The supply mechanism has a temperature control mechanism (not shown). More specifically, an oxygen cylinder as the supply mechanism is covered by a plane heater (not shown) which serves to increase the temperature of the oxygen gas before supply.

In the regions C and D, ultrasonic generators (not shown) to apply ultrasound to the substrate holder 14 and ultrasonic generators (not shown) to apply ultrasound to the gas inlet 17 are arranged. These ultrasonic generators serve to apply ultrasonic vibration to the substrate holder 14 and the gas inlet 17. By applying ultrasonic vibration, the thin film can be crystallized at low temperatures of about 400° C. The ultrasonic generators can be any device that can generate ultrasound.

As a modified exemplary embodiment, ultraviolet irradiation devices can be used instead of the ultrasonic generators. The ultraviolet irradiation devices are devices to apply ultraviolet rays to a thin film deposited on the substrate. The thin film can be crystallized at low temperatures of about 400° C. by applying ultraviolet rays to the thin film.

As another modified exemplary embodiment, soft X-ray irradiation devices can be used instead of the ultrasonic generators. The soft X-ray irradiation devices are devices to apply soft X-rays to a thin film deposited on the substrate. The thin film can be crystallized at low temperatures of about 400° C. by applying soft X-rays to the thin film.

The MOCVD apparatus also includes a control unit (not shown). The control unit serves to control the timing and amount of the source gas brought from the gas inlet 17, the operation of the ultrasonic generators, ultraviolet irradiation devices, or soft X-ray irradiation devices, the timing of ON and OFF of the infrared heating mechanism for RTA, and the operation of the substrate rotation unit 15 to rotate the rotary substrate holder 14. The control unit also controls the MOCVD apparatus to thereby perform a deposition method mentioned below. Other configurations not illustrated in the MOCVD apparatus are the same as those in the related art or that are conventionally known.

A deposition method using the MOCVD apparatus shown in FIGS. 1(a) and 1(b) is below.

Initially, the substrate 13 is placed on and held by the substrate holder 14. The temperature of the substrate 13 in this step is room temperature. Next, the exhaust pump 16 evacuates the inner space of the chamber to 0.1 to several hundred torrs, preferably to 5 to 100 torrs. Then, the substrate rotation unit 15 rotates the substrate holder 14.

Next, the MO source in the MO source container is heated and thereby gasified by the heater. The gasified MO source gas is brought from the MO source container into the pipe in a controlled amount. Separately, the oxygen gas is heated by the plane heater and is brought from the oxygen cylinder into the pipe to thereby mix the MO source gas and the oxygen gas. The oxygen gas has been heated to reduce or suppress the temperature decrease of the substrate surface. The reason is that the resulting thin film will not have satisfactory properties because if oxygen at room temperature is supplied, oxygen is hardly raised in temperature and thereby decreases the temperature of the substrate surface.

The source gas mixture is brought to the gas inlet 17 and is supplied from the gas inlet 17 to the surface of the substrate 13 in the chamber. In this procedure, the ultrasonic generator applies ultrasonic vibration to one or both of the gas inlet 17 and the substrate holder 14. Thus, a thin film is deposited on the substrate surface while rotating the substrate 13. The inside pressure of the deposition chamber during this process is from 0.1 to several hundreds of torrs, and preferably from 5 to 100 torrs.

Concurrently with the film deposition treatment, the substrate is raised in temperature to about 400° C. by action of the infrared heating mechanisms for RTA arranged in the regions C and D. Thus, the thin film deposited on the substrate is crystallized. The thin film can be crystallized at low temperatures of about 400° C., since the ultrasonic vibration is applied at least one of the gas inlet 17 and the substrate holder 14 at the time when the source gas is brought thereinto. Instead of the ultrasonic vibration, ultraviolet rays or soft X-rays can be applied to the thin film after the source gas has been brought thereinto, and thus the thin film can also be crystallized at low temperatures of about 400° C.

According to the first exemplary embodiment, a gas passage is to have a cross-sectional area 100 times or less as large as the opening area of the gas inlet, which cross-sectional area is obtained by cutting the deposition chamber in a direction perpendicular to a flow direction of the source gas. Thus, the volume in the deposition chamber, particularly the volume in the chamber corresponding to the passage housing unit to be a passage to supply the source gas to the substrate 13, is reduced. The adiabatic expansion of the source gas can be reduced or prevented, and temperature decrease of the source gas due to the adiabatic expansion can be effectively reduced or prevented. As a result, a thin film having good properties can be formed.

According to the present exemplary embodiment, the oxygen gas is heated before bringing into the pipe, and thereby the temperature decrease of the source gas can be reduced or prevented. As a result, a thin film having good properties can be easily obtained.

The shapes and sizes of the lower chamber 11 and the upper chamber 12 constituting the deposition chamber are not specifically limited to those described in the exemplary embodiment. They can be any other shapes and sizes, as long as, when the source gas is brought from the gas inlet 17 into the deposition chamber to thereby supply to the substrate, a gas passage in the source gas flow has a cross-sectional area 100 times or less as large as the opening area of the gas inlet, which cross-sectional area is obtained by cutting the deposition chamber in a direction perpendicular to a flow direction of the source gas.

The apparatus according to the present exemplary embodiment has the ultrasonic generators and can thereby apply ultrasonic vibration to the gas inlet 17 when the source gas is brought from the gas inlet 17. Thus, clogging of the deposition materials in the gas inlet 17 can be reduced or prevented, and thereby the source gas can be supplied stably.

The apparatus according to the present exemplary embodiment has the ultrasonic generators and can thereby apply ultrasonic vibration to the substrate holder 14 and to the substrate 13 when the source gas is brought from the gas inlet 17. Thus, crystals can grow stably on the substrate surface and can thereby form a thin film having good properties.

The MOCVD apparatus according to the aforementioned exemplary embodiment may further include an inner space in the region B shown in FIG. 1(b), which inner space has the same configuration with the inner space above the region A of the substrate, and may further include another gas inlet, MO source container, and oxygen cylinder connected to the inner space B in question. Thus, a thin film can be formed on the substrate by the procedure of the aforementioned exemplary embodiment by bringing the same source gas from two gas inlets. Alternatively, a complex multilayer film comprising a thin film and another thin film can be formed by bringing different source gases from the two gas inlets, respectively.

Figure 2:
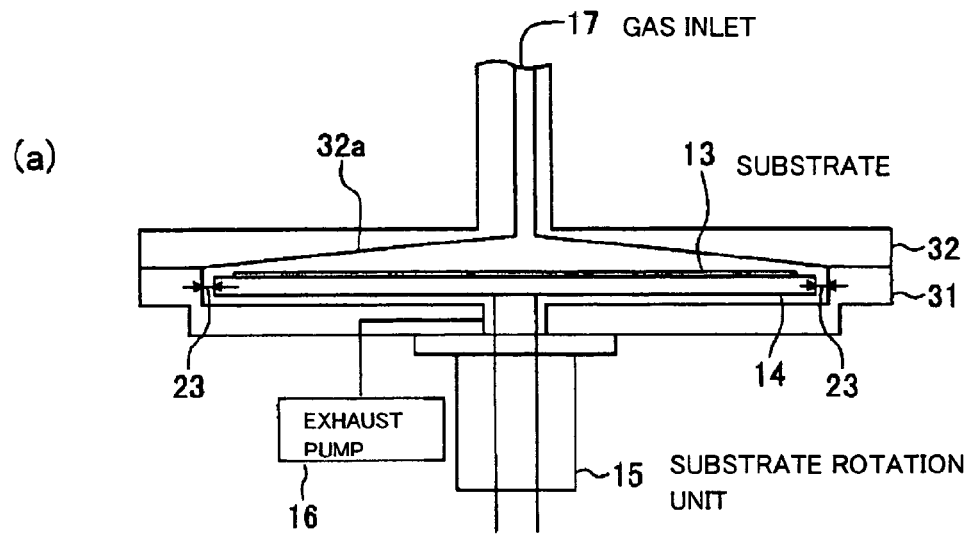
FIGS. 2(a) and 2(b) are schematics of an MOCVD apparatus as a second exemplary embodiment of the present invention.
Figure 2:
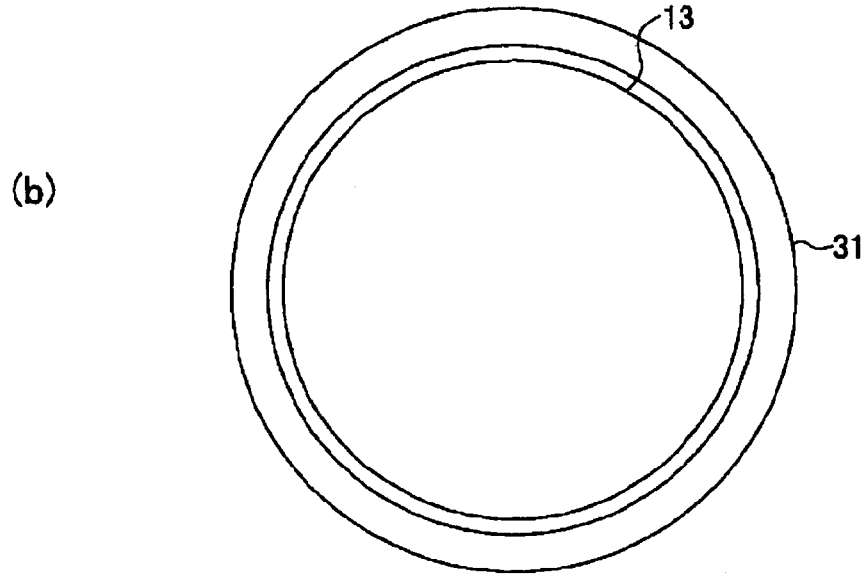

FIG. 2(a) is a sectional view of an MOCVD apparatus according to a second exemplary embodiment of the present invention, and FIG. 2(b) is a top view of the MOCVD apparatus shown in FIG. 2(a), in which the same components as in FIGS. 1(a) and 11(b) have the same reference numerals, and description thereof is omitted as much as possible.

FIGS. 2(a) and 2(b) show that the MOCVD apparatus includes a deposition chamber which includes a lower chamber 31 and an upper chamber 32. By connecting the lower chamber 31 with the upper chamber 32, an inner space of the chamber is formed as shown in FIG. 2(a). A rotary substrate holder 14 to hold a substrate 13 is arranged in an inner space of the lower chamber 31.

A deposition plane of the substrate 13 on which a film is deposited in the deposition chamber is the entire surface of the substrate, as shown in FIG. 2(b). The upper chamber 32 locating above the substrate has an umbrella-like sectional shape having a slope 32a as shown in FIG. 2(a). Namely, the slope 32a is formed overall above the substrate 13. A gas inlet 17 is arranged in the upper chamber 32, is connected to the slope 32a and locates in the vicinity of the center of the substrate surface.

The periphery of the substrate holder 14 is arranged at a set distance 23 from the inner wall of the lower chamber 31. By thus forming the shape of the inner space of the chamber, the source gas brought from the gas inlet 17 can be brought into the entire surface of the substrate. Namely, the source gas flows from the center to the entire periphery of the substrate substantially uniformly. The brought source gas passes through the entire periphery of and under the substrate holder 14 and is exhausted by the action of an exhaust pump 16.

Specifically, the shape of the inner space of the chamber can be illustrated as follows. The deposition chamber is separated into a substrate housing unit and a passage housing unit. The substrate housing unit is the inner space of the lower chamber and serves to house the substrate holder 14 holding the substrate 13. The passage housing unit is connected to the substrate housing unit and constitutes a passage to supply the source gas to the substrate 13. The passage housing unit is an inner space above the entire surface of substrate, which is formed by the slope 32a and the substrate 13. The passage has a cross-sectional area smaller than the area of the deposition plane of the substrate when the passage housing unit is cut in parallel with the deposition plane of the substrate.

More specifically, in the second exemplary embodiment as in the first exemplary embodiment, when the source gas is brought from the gas inlet 17 into the deposition chamber to thereby be supplied to the substrate, a gas passage in the source gas flow has a cross-sectional area 100 times or less as large as the opening area of the gas inlet, which cross-sectional area is obtained by cutting the deposition chamber in a direction perpendicular to a flow direction of the source gas. By thus forming the gas passage, the volume of the inner space of the chamber can be reduced. Thus, temperature decrease of the source gas due to adiabatic expansion can be effectively reduced or suppressed.

A substrate heating mechanism (not shown) to heat the entire substrate 13 is arranged below the substrate holder 14. The substrate heating mechanism serves to crystallize a thin film deposited on the substrate 13, and thus a film can be continuously formed and crystallized in the same chamber. Namely, while rotating the substrate, a thin film is deposited on the substrate, and carbon in the MO source is removed by heating the substrate to about 400° C., and the thin film is crystallized. The MOCVD apparatus further includes a cooling mechanism (not shown) to cool the substrate holder.

The MOCVD apparatus further includes an ultrasonic generator (not shown) to apply ultrasound to the substrate holder 14 and another ultrasonic generator (not shown) to apply ultrasound to the gas inlet 17. Instead of the ultrasonic generators, ultraviolet irradiation devices can be used as a modified exemplary embodiment. Alternatively, instead of the ultrasonic generators, soft X-ray irradiation devices can also be used as a modified exemplary embodiment.

A deposition method using the MOCVD apparatus shown in FIGS. 2(a) and 2(b) is discussed below. However, descriptions on the same procedures as the deposition method using the MOCVD apparatus shown in FIGS. 1(a) and 1(b) are omitted.

The source gas is supplied from the gas inlet 17 to the entire surface of the substrate 13 in the chamber, passes through the entire periphery of the substrate holder 14 and is exhausted by action of the exhaust pump 16 below the substrate holder. Thus, a thin film is deposited on the substrate surface.

Concurrently with the deposition treatment, the substrate is raised in temperature to about 400° C. by action of the substrate heating mechanism. Thus, the thin film deposited on the substrate is crystallized.

The same advantages as the first exemplary embodiment can be obtained in the second exemplary embodiment. Namely, by reducing the volume in the deposition chamber, particularly the volume in the chamber corresponding to the passage housing unit to be a passage to supply the source gas to the substrate 13, adiabatic expansion of the source gas can be reduced or prevented, and temperature decrease of the source gas due to the adiabatic expansion can be effectively reduced or prevented. As a result, a thin film having acceptable or good properties can be formed.

The present invention is not specifically limited to the disclosed exemplary embodiments and covers various modifications. For example, various raw materials or sources suitable for a thin film to be formed can be used as the film-forming materials.

The invention claimed is:

1. An MOCVD apparatus to supply a source gas, as a mixture of an MO source gas, with an oxidizing gas to a substrate to thereby form a film, the apparatus comprising:
   a substrate holder to hold the substrate;
   a deposition chamber to house the substrate holder;
   a supply mechanism to supply the source gas to a surface of the substrate; and
   a heating device to heat the substrate held by the substrate holder;
   the deposition chamber including a substrate housing unit to house the substrate holder and a passage housing unit connected to gas supply mechanism, the passage housing unit comprising a plurality of first portions and a plurality of second portions disposed over the substrate alternately, the first portions being formed by a slope of an upside of the deposition chamber and the substrate, and the second portions formed by a substantially or exactly horizontal surface of the deposition chamber and the substrate, the first portions allowing an area of the substrate below them to be exposed to deposition and the second portions preventing an area of the substrate under them from exposure to deposition;
   the passage having a cross-sectional area that is smaller than an area of a deposition plane of the substrate when the passage housing unit is cut in parallel with the deposition plane of the substrate.

2. The MOCVD apparatus according to claim 1 the supply mechanism including an MO source container housing the MO source, a first heating mechanism to heat the MO source in the MO source container, an oxidizing gas container housing the oxidizing gas, and a second heating mechanism to heat the oxidizing gas in the oxidizing gas container, the MO source container and the oxidizing gas container being connected to the gas inlet, respectively.

3. The MOCVD apparatus according to claim 1 further including a rotating mechanism to rotate the substrate holder.

4. The MOCVD apparatus according to claim 1 further including an ultrasonic generator to apply ultrasonic vibration to at least one of the supply mechanism and the substrate holder.

5. The MOCVD apparatus according to claim 1 further including at least one of an ultraviolet irradiation device and a soft X-ray irradiation device to apply at least one of ultraviolet rays and soft X-rays to the substrate held by the substrate holder.

6. An MOCVD apparatus to supply a source gas, as a mixture of an MO source gas, with an oxidizing gas to a substrate to a substrate to thereby form a film, the apparatus comprising:
   a substrate holder to hold the substrate;
   a deposition chamber to house the substrate holder;
   a gas inlet arranged in the deposition chamber;
   a supply mechanism to supply the source gas to the gas inlet; and
   a heating device to heat the substrate held by the substrate holder;
   a gas passage, comprising a plurality of first portions and second portions disposed over the substrate alternately, the first portions being formed by a slope of an upside of the deposition chamber and the substrate, and the second portions being formed by a substantially or exactly horizontal surface of the deposition chamber and the substrate, the first portions allowing an area of the substrate below them to be exposed to deposition and the second portions preventing an area of the substrate below them from exposure to deposition;
   the deposition chamber defining the gas passage that has a cross-sectional area 100 times or less as large as an opening area of the gas inlet, the cross-sectional area being obtained by cutting the deposition chamber in a direction perpendicular to a flow direction of the source gas when the supply mechanism supplies the source gas to the gas inlet to thereby supply the source gas to the substrate in the deposition chamber.

7. An MOCVD apparatus to supply a source gas, as a mixture of an MO source gas, with an oxidizing gas to a substrate to a substrate to thereby form a film, the apparatus comprising:
   a substrate holder to hold the substrate;
   a deposition chamber to house the substrate holder;
   a gas inlet arranged in the deposition chamber;
   a supply mechanism to supply the source gas to the gas inlet; and
   a heating device to heat the substrate held by the substrate holder;
   a gas passage, which is formed by a slope of an upside of the deposition chamber and the substrate, the gas passage comprising a plurality of first portions and a plurality of second portions disposed over the substrate alternately, the first portions being formed by the slope of the upside of the deposition chamber and the substrate, and the second portions being formed by a substantially or exactly horizontal surface, and the first portions allowing an area of the substrate below them to be exposed to deposition and the second portions preventing an area of the substrate below them from exposure to deposition;
   the deposition chamber defining the gas passage that has a cross-sectional area 100 times or less as large as an opening area of the gas inlet, the cross-sectional area being obtained by cutting the deposition chamber in a direction perpendicular to a flow direction of the source gas when the supply mechanism supplies the source gas to the gas inlet to thereby supply the source gas to the substrate in the deposition chamber and reduce an adiabatic expansion of the source gas to suppress a temperature decrease of the source gas.

* * * * *